(12) United States Patent
Liu et al.

(10) Patent No.: US 11,240,906 B2
(45) Date of Patent: Feb. 1, 2022

(54) CIRCUIT BOARD HEAT DISSIPATION SYSTEM

(71) Applicant: ADVANTECH CO., LTD., Taipei (TW)

(72) Inventors: Yu-Chin Liu, Taipei (TW); Wen-Yuan Yi, Taipei (TW)

(73) Assignee: ADVANTECH CO., LTD., Taipei (TW)

( * ) Notice: Subject to any disclaimer, the term of this patent is extended or adjusted under 35 U.S.C. 154(b) by 0 days.

(21) Appl. No.: 17/110,848

(22) Filed: Dec. 3, 2020

(65) Prior Publication Data
US 2021/0352799 A1 Nov. 11, 2021

(30) Foreign Application Priority Data
May 11, 2020 (TW) .................. 109115621

(51) Int. Cl.
*H05K 1/02* (2006.01)
*H05K 7/20* (2006.01)

(52) U.S. Cl.
CPC ......... *H05K 1/0203* (2013.01); *H05K 7/2039* (2013.01); *H05K 7/20136* (2013.01); *H05K 2201/10409* (2013.01)

(58) Field of Classification Search
CPC . G06F 1/20; G06F 1/185; G06F 1/184; G06F 1/183; H05K 2201/10409; H05K 1/0203; H05K 7/2039; H05K 1/141; H05K 2201/10189; H05K 1/181; H05K 1/144; H05K 2201/2036; H05K 3/366; H05K 2201/042; H05K 1/0204; H05K 2201/066; H05K 7/142; H05K 7/20136
See application file for complete search history.

(56) References Cited

U.S. PATENT DOCUMENTS 5,838,542 A * 11/1998 Nelson .................... G06F 1/185
361/704
6,384,331 B1 * 5/2002 Ku .......................... G06F 1/20
174/544

(Continued)

FOREIGN PATENT DOCUMENTS

CN 101309569 11/2008
TW 201044961 12/2010

OTHER PUBLICATIONS

Search Report issued in TW Appln. No. 109115621 dated Jan. 29, 2021 (w/ English translation).

*Primary Examiner* — Adam B Dravininkas
(74) *Attorney, Agent, or Firm* — Nixon & Vanderhye PC

(57) ABSTRACT

A circuit board heat dissipation system includes circuit board unit that includes a motherboard and a daughterboard, a base seat, and a fastening unit that includes a plurality of first and second fastening components. Each first fastening component extends through the daughterboard and is engaged with the base seat. Each second fastening component includes a long fastener that extends through the base seat and the daughterboard and that is engaged with the motherboard, and a flat washer and a resilient member that are sleeved on the long fastener. The resilient member is disposed between a head portion of the long fastener and the flat washer for biasing the base seat and the daughterboard against the motherboard.

7 Claims, 6 Drawing Sheets

(56) References Cited

U.S. PATENT DOCUMENTS

| | | | | |
|---|---|---|---|---|
| 6,477,058 | B1* | 11/2002 | Luebs | H05K 1/141 |
| | | | | 174/250 |
| 7,336,496 | B1* | 2/2008 | Hsu | G06F 1/184 |
| | | | | 165/185 |
| 7,576,989 | B2* | 8/2009 | Li | H01L 23/4093 |
| | | | | 165/185 |
| 2002/0109963 | A1* | 8/2002 | Aoki | G06F 1/184 |
| | | | | 361/679.41 |
| 2006/0007659 | A1* | 1/2006 | Lee | H01L 23/4006 |
| | | | | 361/704 |
| 2014/0355182 | A1* | 12/2014 | Wang | H05K 7/142 |
| | | | | 361/679.01 |
| 2020/0235036 | A1* | 7/2020 | Lin | H01L 23/3672 |

* cited by examiner

CIRCUIT BOARD HEAT DISSIPATION SYSTEM

CROSS-REFERENCE TO RELATED APPLICATION

This application claims priority of Taiwanese Patent Application No. 109115621, filed on May 11, 2020.

FIELD

The disclosure relates to a heat dissipation system, and more particularly to a circuit board heat dissipation system including a circuit board unit, a heatsink unit and a fastening unit.

BACKGROUND

In surface-mount technology (SMT), a ball grid array (BGA) integrated circuit component, such as a central processing unit (CPU), is mounted to a printed circuit board (PCB) by using solder balls as interconnecting pins to form solder joints. Since such solder joints are not malleable, localized stress on the PCB can easily result in breaking of the solder joints (i.e., breaking of connection between the BGA integrated circuit component and the PCB). Thus, the localized stress must be strictly controlled, especially in areas around the integrated circuit component on the PCB.

In addition, since integrated circuit components often generate heat during operation, the PCB is often mounted with heat dissipation devices to prevent the integrated circuit components from overheating. Also, since the heat dissipation devices are usually mounted to the PCB by screws, a fixture is often used to avoid excessive localized stress caused by fastening the screws, which leads to increased tooling costs and complicated manufacturing workflows. Moreover, in cases where the heat dissipation devices and the integrated circuit components are mounted to a small circuit board which is installed on a large circuit board (e.g., a daughterboard installed on a motherboard), the small circuit board is even more susceptible to excessive stress localization for having a smaller surface area.

SUMMARY

Therefore, the object of the disclosure is to provide a circuit board heat dissipation system that can alleviate at least one of the drawbacks of the prior art.

According to the disclosure, a circuit board heat dissipation system includes a circuit board unit, a heatsink unit and a fastening unit.

The circuit board unit includes a motherboard that has a plurality of fastening parts, and a daughterboard that is disposed on the motherboard and that has a plurality of first through holes and a plurality of second through holes. The second through holes of the daughterboard are registered respectively with the fastening parts of the motherboard.

The heatsink unit includes a base seat that is disposed on the daughterboard opposite to the motherboard and that has a bottom face, a top face, a plurality of first mounting holes and a plurality of second mounting holes.

The bottom face of the base seat is connected to the daughterboard. The top face of the base seat is opposite to the bottom surface. Each of the first mounting holes of the base seat extends through the bottom face, and is registered with a respective one of the first through holes of the daughterboard. Each of the second mounting holes of the base seat extends from the bottom face to the top face, and is registered with a respective one of the second through holes of the daughterboard.

The fastening unit includes a plurality of first fastening components and a plurality of second fastening components.

Each of the first fastening components extends through a respective one of the first through holes of the daughterboard, and is engaged with a respective one of the first mounting holes to fasten the daughterboard and the base seat together. Each of the second fastening components includes a long fastener, a resilient member and a flat washer.

The long fastener has a long rod body, a head portion and a fastening portion.

The head portion of the long fastener is connected to one of opposite ends of the long rod body and is disposed outside of the base seat. A cross sectional area of the head portion of the long fastener parallel to the top face of the base seat is greater than that of the long rod body of the long fastener. The fastening portion of the long fastener is connected to the other one of the opposite ends of the long rod body. The long rod body and the fastening portion of the long fastener extend through a respective one of the second mounting holes of the base seat and through a respective one of the second through holes of the daughterboard. The fastening portion of the long fastener is engaged with one of the fastening parts of the motherboard that is registered with the respective one of the second through holes.

The flat washer is sleeved on the long rod body of the long fastener and abuts against the top face of the base seat. The resilient member is sleeved on the long rod body of the long fastener and is disposed between the head portion of the long fastener and the flat washer for biasing the base seat and the daughterboard against the motherboard.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
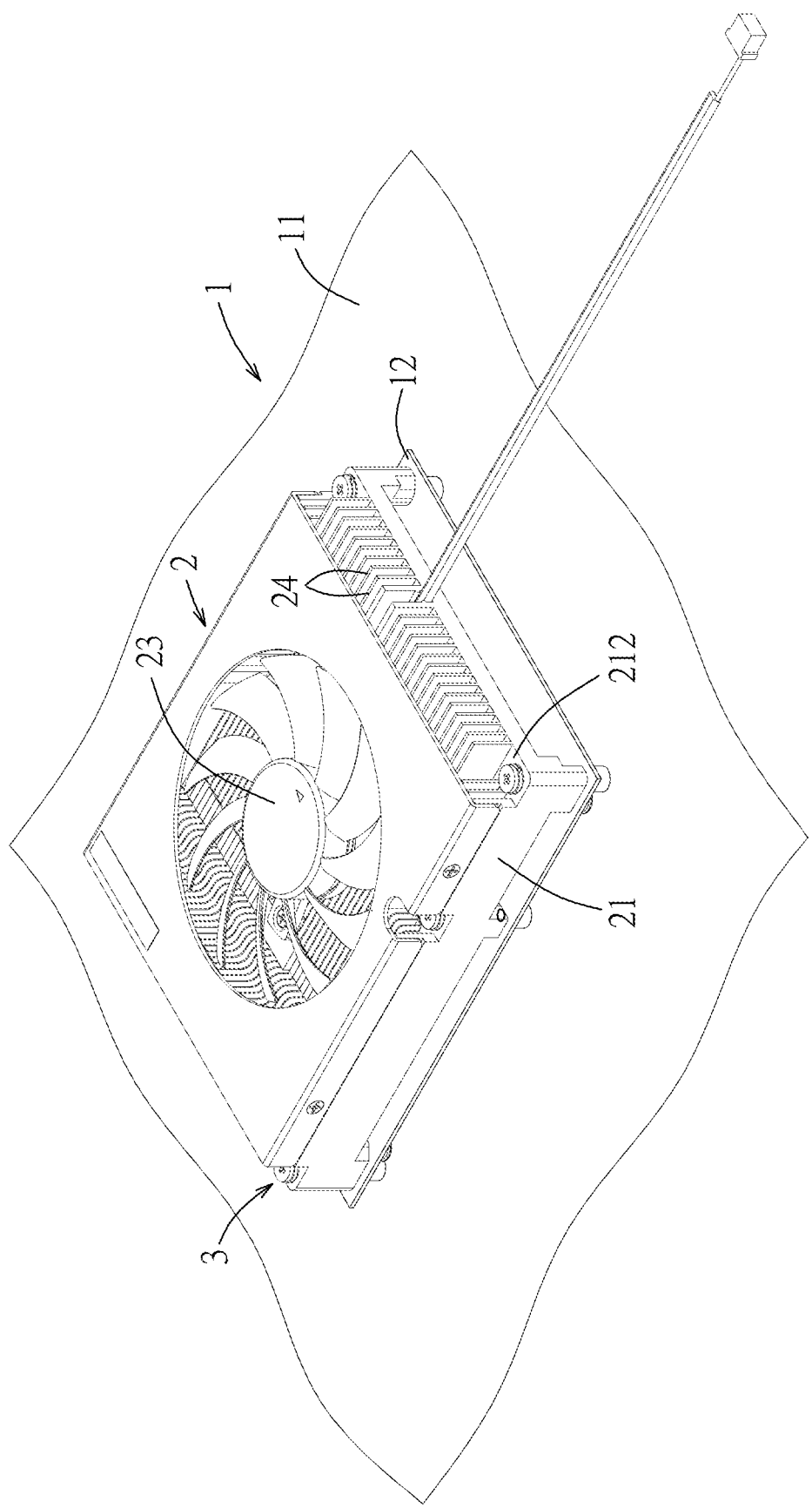
FIG. 1 is a fragmentary perspective view of an embodiment of a circuit board heat dissipation system according to the disclosure.
Figure 2:
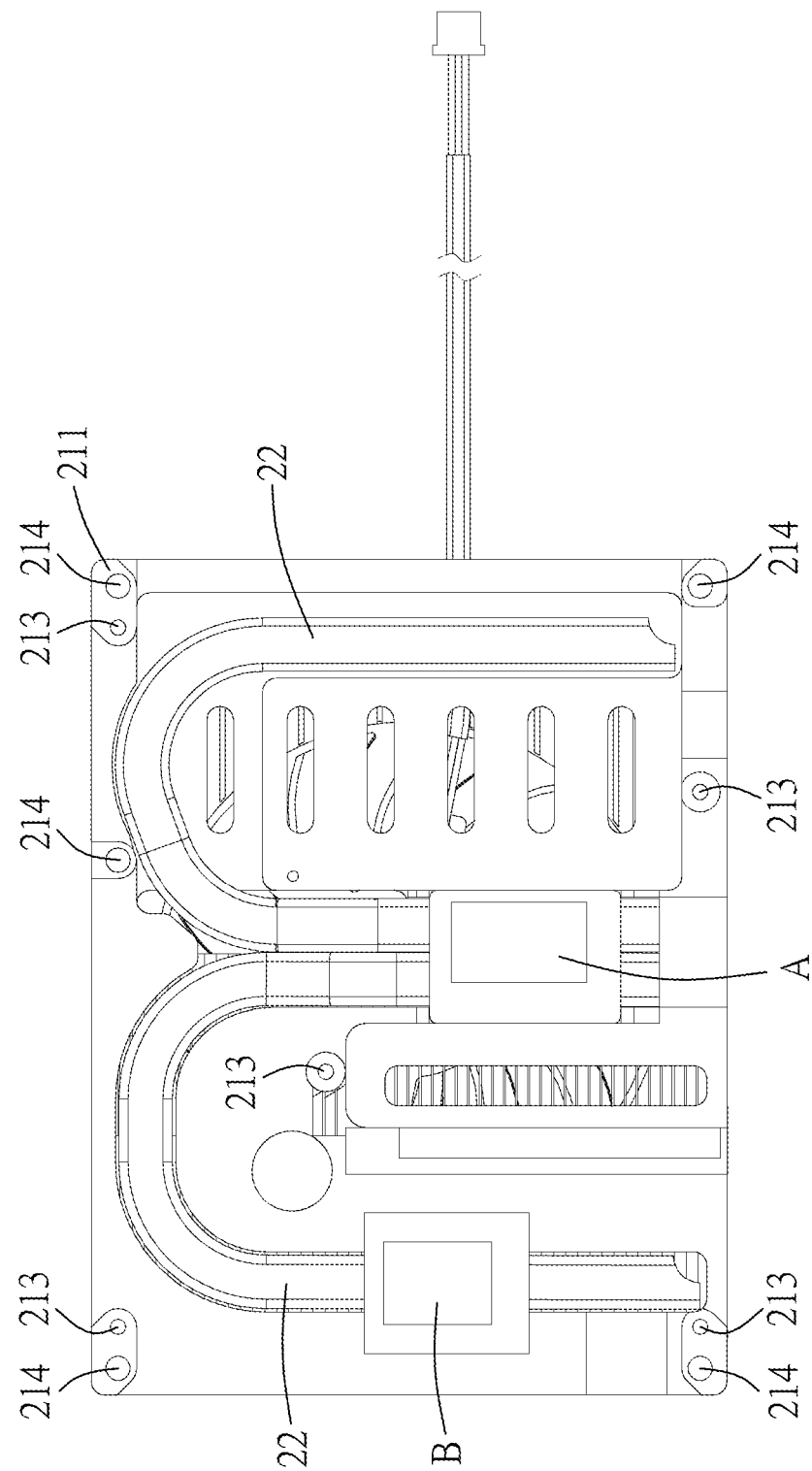
FIG. 2 is a bottom view of a heatsink unit of the embodiment.
Figure 3:
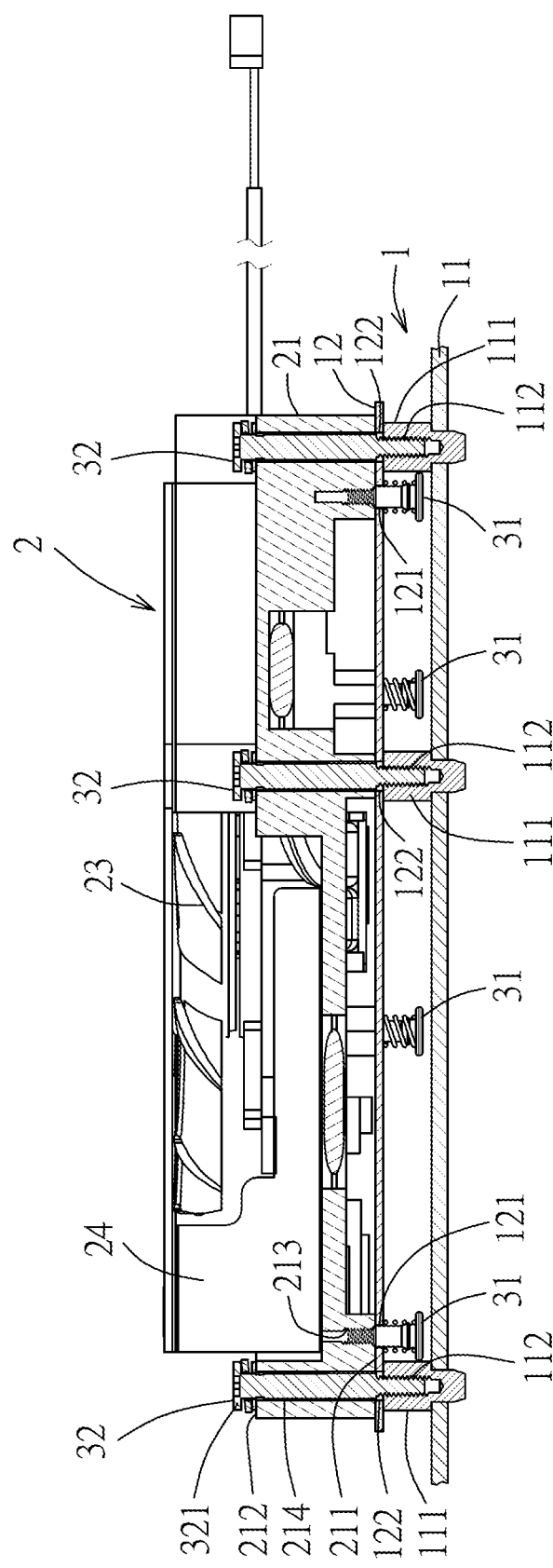
FIG. 3 is a fragmentary sectional view of the embodiment.
Figure 4:
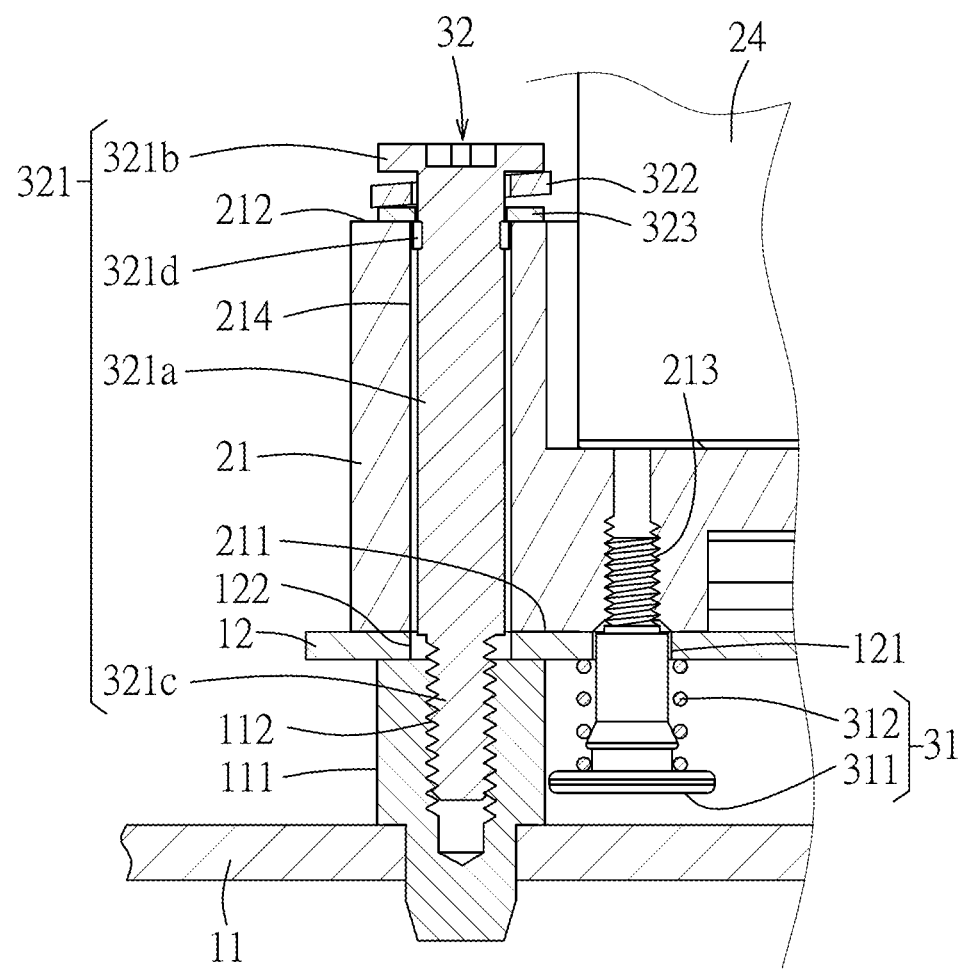
FIG. 4 is an enlarged fragmentary view of FIG. 3.

Referring to FIGS. 1 to 4, an embodiment of a circuit board heat dissipation system according to the disclosure includes a circuit board unit 1, a heatsink unit 2 and a fastening unit 3.

The circuit board unit 1 includes a motherboard 11 and a daughterboard 12. The motherboard 11 has a plurality of fastening parts 111. Each of the fastening parts 111 is configured as a protrusion, and is formed with a screw hole 112. Specifically, in this embodiment, the motherboard 11 has a board body, and each fastening part 111 is a stud mounted to the board body. The daughterboard 12 is disposed on the motherboard 11, has a plurality of first through holes 121 and a plurality of second through holes 122, and is mounted with a CPU (not shown) and a platform controller hub (PCH) (not shown). The second through holes 122 of the daughterboard 12 are registered respectively with the fastening parts 111 of the motherboard 11.

The heatsink unit 2 includes a base seat 21, two heatpipes 22, a cooling fan 23 and a plurality of cooling fins 24.

The base seat 21 is disposed on the daughterboard 12 opposite to the motherboard 11, and has a bottom face 211, a top face 212, a plurality of first mounting holes 213 and a plurality of second mounting holes 214.

The bottom face 211 of the base seat 21 is connected to the daughterboard 12. The top face 212 of the base seat 21 is opposite to the bottom surface 211. Each of the first mounting holes 213 of the base seat 21 extends through the bottom face 211, is registered with a respective one of the first through holes 121 of the daughterboard 12, and is configured as a screw hole. Each of the second mounting holes 214 of the base seat 21 extends from the bottom face 211 to the top face 212, and is registered with a respective one of the second through holes 122 of the daughterboard 12.

The heatpipes 22 are connected to the bottom face 211 of the base seat 21, and have a CPU contact section (A) and a PCH contact section (B) (see FIG. 2) that respectively correspond in position with the CPU and the PCH of the daughterboard 12, such that heat generated by the CPU and the PCH can be transferred to the heatpipes 22 via conduction. It should be noted that the configuration and number of the heatpipes 22 may vary in other embodiments of the disclosure. For example, the heatsink unit 2 may include only one heatpipe 22.

The cooling fan 23 is connected to the top face 212 of the base seat 21, and the cooling fins 24 are disposed between the heatpipes 22 and the cooling fan 23. The heat transferred to the heatpipes 22 can be further transferred to the cooling fins 24, and then be dissipated to the ambient environment by the cooling fins 24 and the cooling fan 23.

The fastening unit 3 includes a plurality of first fastening components 31 and a plurality of second fastening components 32.

Figures 5, 6:
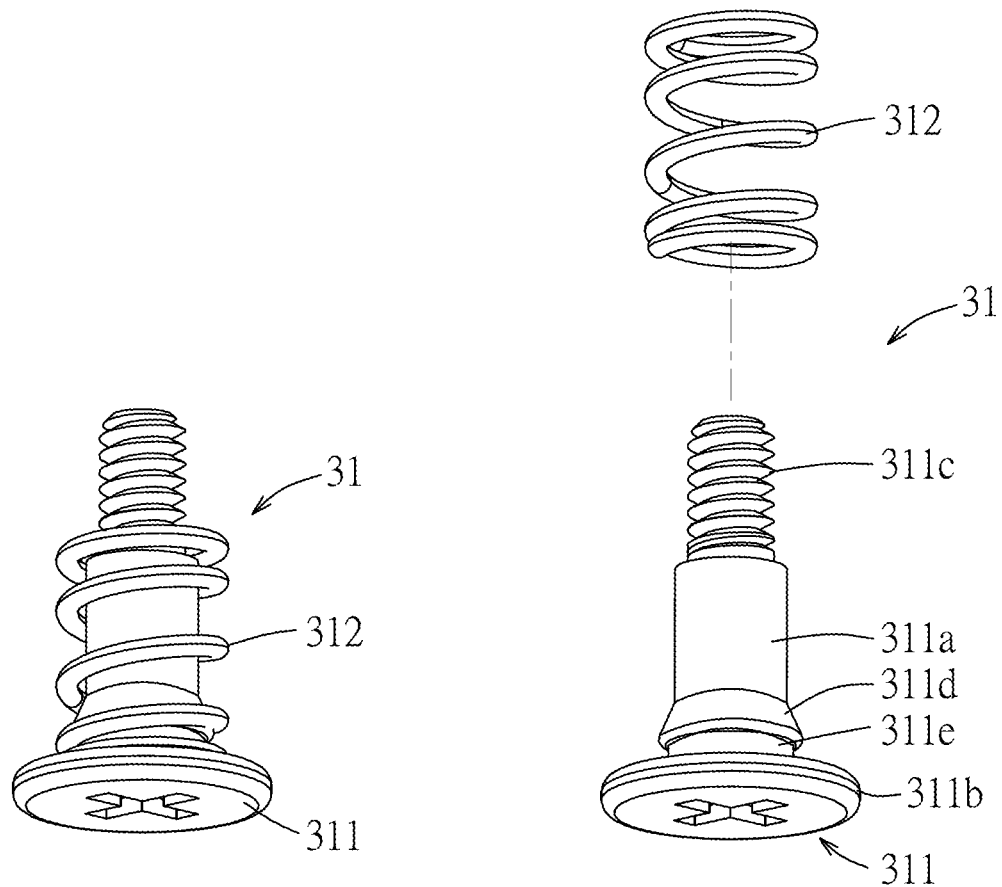
FIG. 5 is an assembled perspective view of a first fastening component of the embodiment.
FIG. 6 is an exploded perspective view of the first fastening component of the embodiment.
Figures 7, 8:
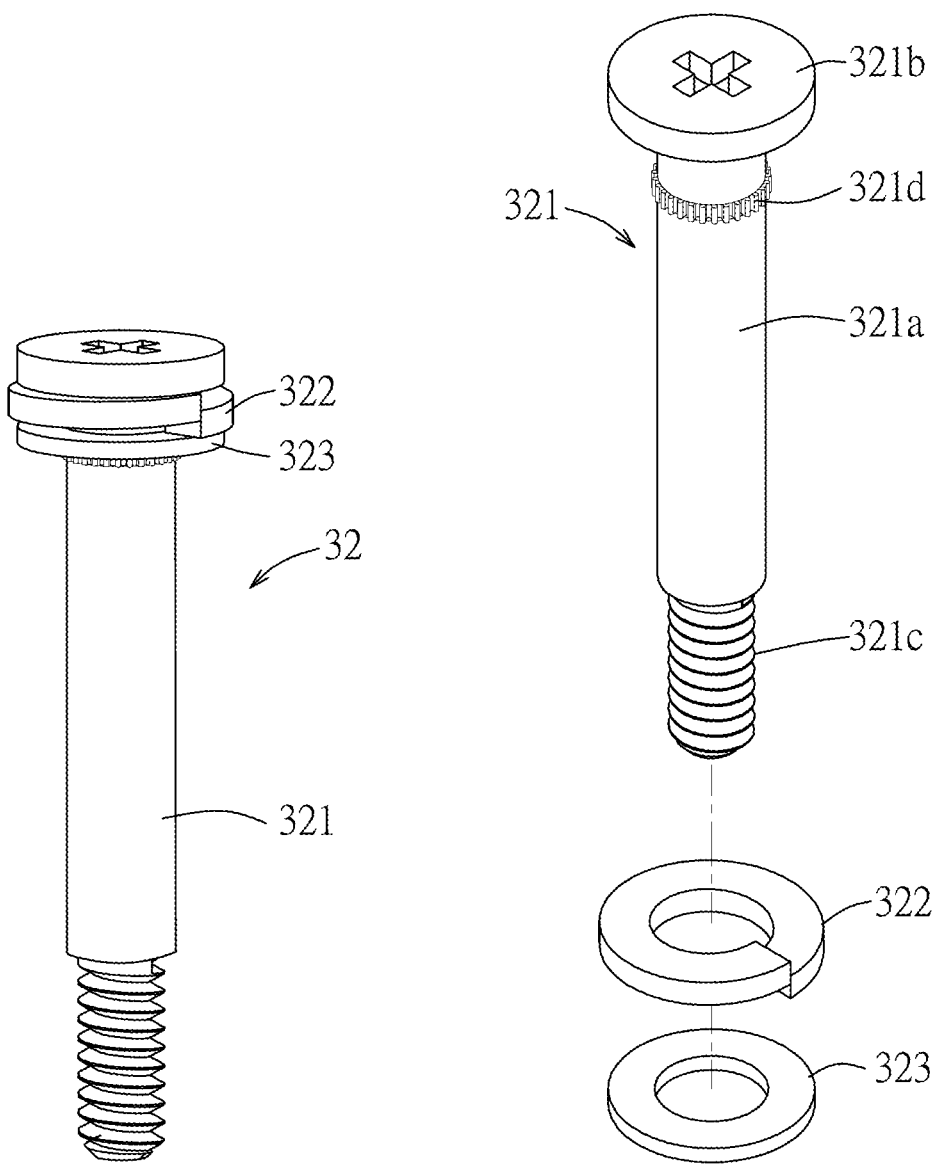
FIG. 7 is an assembled perspective view of a second fastening component of the embodiment.
FIG. 8 is an exploded perspective view of the second fastening component of the embodiment.

Referring further to FIGS. 5 and 6, each of the first fastening components 31 extends through a respective one of the first through holes 121 of the daughterboard 12, and is engaged with a respective one of the first mounting holes 213 of the base seat 21 to fasten the daughterboard 12 and the base seat 21 together.

Specifically, each of the first fastening components 31 includes a short fastener 311 and a compression spring 312. The short fastener 311 of each of the first fastening components 31 has a short rod body 311a, a head portion 311b, a fastening portion 311c and a blocking portion 311d.

For the short fastener 311 of each of the first fastening components 31, the short rod body 311a extends through the respective one of the first through holes 121 of the daughterboard 12; the head portion 311b is connected to one of opposite ends of the short rod body 311a, and is disposed between the daughterboard 12 and the motherboard 11; the fastening portion 311c is connected to the other one of the opposite ends of the short rod body 311a, is provided with an external thread, and is threadedly engaged with the respective one of the first mounting holes 213 of the base seat 21; and the blocking portion 311d surrounds and is connected to the short rod body 311a, and cooperates with the head portion 311b to define a ring groove 311e therebetween. It should be noted that a cross sectional area of the head portion 311b of the short fastener 311 of each of the first fastening components 31 parallel to the daughterboard 12 is greater than that of the short rod body 311a of the short fastener 311.

The compression spring 312 of each of the first fastening components 31 has an end segment that is engaged with the ring groove 311e of the short fastener 311, and is sleeved on the short rod body 311a of the short fastener 311 between the head portion 311b of the short fastener 311 and the daughterboard 12 for biasing the daughterboard 12 against the base seat 21. In such a manner, a gap between the CPU and PCH of the daughterboard 12 and the heatpipes 22 is minimized by the compression springs 312 of the first fastening components 31. As a result, a thermal gap pad (not shown), which is generally used to fill the aforementioned gap, can be replaced by a thermal interface material (or thermal paste, not shown), which is thinner and has better heat dissipation capacity than does the thermal gap pad, to maximize heat transfer and dissipation.

Also, by virtue of a damping effect provided by the compression springs 312 of the first fastening components 31, localized stress of the daughterboard 12 can be reduced without the aid of a fixture; that is, no fixture is needed during the process of fastening the daughterboard 12 to the base seat 21, thus simplifying a manufacturing workflow and reducing tooling costs.

Referring to FIGS. 1 to 4 and FIGS. 7 and 8, each of the second fastening components 32 includes a long fastener 321, a resilient member 322 and a flat washer 323. The long fastener 321 of each of the second fastening components 32 has a long rod body 321a, a head portion 321b, a fastening portion 321c and a restricting portion 321d.

For the long fastener 321 of each of the second fastening components 32, the head portion 321b is connected to one of opposite ends of the long rod body 321a, and is disposed outside of the base seat 21; the fastening portion 321c is connected to the other one of the opposite ends of the long rod body 321a; the long rod body 321a and the fastening portion 321c extend through a respective one of the second mounting holes 214 of the base seat 21 and through a respective one of the second through holes 122 of the daughterboard 12; the fastening portion 321c is provided with an external thread and is threadedly engaged with the screw hole 112 of one of the fastening parts 111 of the motherboard 11 that is registered with the respective one of the second through holes 122; and the restricting portion 321d protrudes from the long rod body 321a, is formed by knurling, is disposed in the respective one of the second mounting holes 214 of the base seat 21, and has a top edge that is substantially flush with the top face 212 of the base seat 21.

It should also be noted that, similar to the first fastening components 31, a cross sectional area of the head portion 321b of the long fastener 321 of each of the second fastening components 32 parallel to the top face 212 of the base seat 21 is greater than that of the long rod body 321a of the long fastener 321.

For each of the second fastening components 32, the resilient member 322 and the flat washer 323 are sleeved on the long rod body 321a of the long fastener 321, and are disposed between the restricting portion 321d and the head portion 321b of the long fastener 321; the flat washer 323 abuts against the top face 212 of the base seat 21; and the resilient member 322 is disposed between the head portion 321b of the long fastener 321 and the flat washer 323 for biasing the base seat 21 and the daughterboard 12 against the motherboard 11. In the present embodiment, the resilient member 322 of each of the second fastening components 32 is a spring lock washer.

By virtue of the abovementioned configuration, the resilient members 322 of the second fastening components 32 allow the daughterboard 12 and the heatsink unit 2 to slide slightly relative to the long rod bodies 321a of the second fastening components 32. Thus, similar to the first fastening components 31, a damping effect provided by the resilient members 322 of the second fastening components 32 is able to reduce the localized stress of the daughterboard 12 without the aid of a fixture.

In addition, by virtue of the spring lock washer having a short compression distance, the resilient members 322 of the second fastening components 32 are able to minimize the sliding movement of the daughterboard 12 and the heatsink unit 2, thus avoiding unwanted shaking of components.

In summary, by virtue of the configurations of the first and second fastening components 31, 32, the present embodiment of the disclosure is able to reduce stress localization without using a fixture during the process of assembling the heatsink unit 2 and the circuit board unit 1 together. Thus, compared with the prior art, the present embodiment has a simpler manufacturing workflow and lower tooling costs.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A circuit board heat dissipation system comprising:
a circuit board unit including
a motherboard that has a plurality of fastening parts, and
a daughterboard that is disposed on said motherboard and that has a plurality of first through holes and a plurality of second through holes, said second through holes being registered respectively with said fastening parts of said motherboard;
a heatsink unit including
a base seat that is disposed on said daughterboard opposite to said motherboard, and that has
a bottom face connected to said daughterboard,
a top face opposite to said bottom surface,
a plurality of first mounting holes, each of said first mounting holes extending through said bottom face and being registered with a respective one of said first through holes of said daughterboard, and
a plurality of second mounting holes, each of said second mounting holes extending from said bottom face to said top face and being registered with a respective one of said second through holes of said daughterboard; and
a fastening unit including
a plurality of first fastening components, each of said first fastening components extending through a respective one of said first through holes and being engaged with a respective one of said first mounting holes to fasten said daughterboard and said base seat together, and
a plurality of second fastening components, each of said second fastening components including
a long fastener that has
a long rod body,
a head portion connected to one of opposite ends of said long rod body and disposed outside of said base seat, a cross sectional area of said head portion parallel to said top face of said base seat being greater than that of said long rod body, and
a fastening portion connected to the other one of said opposite ends of said long rod body, said long rod body and said fastening portion extending through a respective one of said second mounting holes of said base seat and through a respective one of said second through holes of said daughterboard, said fastening portion being engaged with one of said fastening parts of said motherboard that is registered with the respective one of said second through holes,
a flat washer that is sleeved on said long rod body of said long fastener and that abuts against said top face of said base seat, and
a resilient member that is sleeved on said long rod body of said long fastener and that is disposed between said head portion of said long fastener and said flat washer for biasing said base seat and said daughterboard against said motherboard.

2. The circuit board heat dissipation system as claimed in claim 1, wherein:
each of said fastening parts of said motherboard is configured as a protrusion and is formed with a screw hole; and
said fastening portion of said long fastener of each of said second fastening components is provided with an external thread and is threadedly engaged with said screw hole of said respective one of said fastening parts of said motherboard.

3. The circuit board heat dissipation system as claimed in claim 1, wherein said resilient member of each of said second fastening components is a spring lock washer.

4. The circuit board heat dissipation system as claimed in claim 1, wherein:
each of said first mounting holes of said base seat is configured as a screw hole; and
each of said first fastening components includes
a short fastener having
a short rod body that extends through said respective one of said first through holes of said daughterboard, a head portion that is connected to one of opposite ends of said short rod body and that is disposed between said daughterboard and said motherboard, a cross sectional area of said head portion parallel to said daughterboard being greater than that of said short rod body, and a fastening portion that is connected to the other one of said opposite ends of said short rod body, that is provided with an external thread, and that is threadedly engaged with said respective one of said first mounting holes of said base seat, and a compression spring being sleeved on said short rod body of said short fastener between said head portion of said short fastener and said daughterboard for biasing said daughterboard against said base seat.

5. The circuit board heat dissipation system as claimed in claim 4, wherein:

said short fastener of each of said first fastening components further has a blocking portion that surrounds and is connected to said short rod body and that cooperates with said head portion to define a ring groove therebetween; and said compression spring of each of said first fastening components has an end segment that is engaged with said ring groove of said short fastener.

6. The circuit board heat dissipation system as claimed in claim 1, wherein said heatsink unit further includes:

at least one heatpipe connected to said bottom face of said base seat;

a cooling fan connected to said top face of said base seat; and a plurality of cooling fins disposed between said at least one heatpipe and said cooling fan.

7. The circuit board heat dissipation system as claimed in claim 1, wherein, for each of said second fastening components, said long fastener further has a restricting portion that protrudes from said long rod body and that is disposed in said respective one of said second mounting holes of said base seat, and said resilient member and said flat washer are disposed between said restricting portion and said head portion.

* * * * *